United States Patent
Tsai et al.

(10) Patent No.: US 6,274,484 B1
(45) Date of Patent: Aug. 14, 2001

(54) FABRICATION PROCESS FOR LOW RESISTIVITY TUNGSTEN LAYER WITH GOOD ADHESION TO INSULATOR LAYERS

(75) Inventors: Ming-Hsing Tsai, Taipei; Sheng-Hsiung Cheu, Taichung County, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/527,184

(22) Filed: Mar. 17, 2000

(51) Int. Cl.[7] ................................................. H01L 21/4763
(52) U.S. Cl. ........................... 438/648; 438/637; 438/656
(58) Field of Search ........................................ 438/585, 591, 438/637, 648, 652, 654, 656

(56) References Cited

U.S. PATENT DOCUMENTS

| | | | |
|---|---|---|---|
| 5,907,188 | * | 5/1999 | Nakajima et al. .................... 257/751 |
| 5,913,145 | | 6/1999 | Lu et al. ............................... 438/643 |
| 5,923,999 | | 7/1999 | Balasubramanyam et al. ..... 438/592 |
| 5,939,788 | | 8/1999 | McTeer ................................ 257/751 |
| 6,103,609 | * | 8/2000 | Lee et al. ............................. 438/592 |

FOREIGN PATENT DOCUMENTS

| | | | |
|---|---|---|---|
| 908934 | * | 4/1999 | (EP) . |
| WO 98/23389 | * | 6/1998 | (WO) . |

* cited by examiner

*Primary Examiner*—Trung Dang
(74) *Attorney, Agent, or Firm*—George O'Saile; Stephen B. Ackerman

(57) ABSTRACT

A process for forming a low resistivity tungsten layer, for use as a metal gate structure, or a metal damascene structure, has been developed. The process features initial deposition of a metastable tungsten nitride layer, via a plasma enhanced, or metal organic chemical vapor deposition procedures, resulting in good adhesion, in addition to good step coverage, of the tungsten nitride layer, to underlying or adjacent insulator layers. The high resistivity, tungsten nitride layer is then converted to a lower resistivity tungsten layer, via a rapid thermal anneal procedure, performed in an argon ambient, or in vacuum.

8 Claims, 3 Drawing Sheets

FABRICATION PROCESS FOR LOW RESISTIVITY TUNGSTEN LAYER WITH GOOD ADHESION TO INSULATOR LAYERS

BACKGROUND OF THE INVENTION (1) Field of the Invention

The present invention relates to methods used to fabricate semiconductor devices, and more specifically to a method used to form low resistivity tungsten layers, featuring good adhesion to underlying dielectric layers.

(2) Description of Prior Art

The mid-band gap of tungsten, as well as the attractive work function of tungsten—silicon, make tungsten an attractive option as a gate material for metal oxide semiconductor field effect transistor, (MOSFET), devices. In addition the low resistivity, as well as the high electromigration resistance of tungsten, also makes this metal an attractive candidate for metal interconnect structures. Tungsten layers can be obtained using either chemical vapor deposition, (CVD), or plasma vapor deposition, (PVD), procedures, however both deposition modes can present difficulties For example the desired low resistivity of CVD tungsten layers, deposited at temperatures greater than 400° C., using tungsten hexafluoride as a source, is in fact realized, however the adhesion of CVD tungsten to underlying dielectric layers can be marginal. Therefore the use of CVD tungsten, as a gate material, overlying a silicon dioxide layer, or the use of CVD tungsten as a damascene structure, formed in openings in silicon oxide layers, can present adhesion limitations. Tungsten layers obtained via PVD procedures, although resulting in improved adhesion to underlying insulator layers, when compared to CVD counterparts, can damage an underlying gate insulator layer, increasing the risk of alpha particle generation, therefore precluding PVD procedures as a method of forming tungsten gate structures. In addition the poor step coverage of PVD layers, restrict its use as a damascene metal layer.

This invention will describe a process for obtaining tungsten layers, featuring the desired characteristics such as low resistivity, good adhesion to underlying insulator layers, as well as an absence of alpha particle generation. A process of depositing a metastable tungsten nitride layer via a deposition procedure that results in good step coverage, in good adhesion, and with an absence of alpha particle generation to underlying insulator layers, is first performed. A subsequent anneal procedure then converts the high resistivity, metastable tungsten nitride layer, to a low resistivity tungsten layer, still retaining the desired adhesion to underlying silicon oxide layers. Prior art such as Lu et al, in U.S. Pat. No. 5,913,145, as well as Balasubramanyuam et al, in U.S. Pat. No. 5,923,999, describe methods of forming tungsten nitride layers for use as a barrier layer, as well as for use as a gate material, however these prior arts do not teach the present invention in which the optimum properties of tungsten are obtained via formation of a metastable tungsten nitride layer, converted to the desired tungsten layer.

SUMMARY OF THE INVENTION

It is an object of this invention to form a tungsten layer, to be used for a MOSFET gate structure, and to be used for a damascene metal structure, with the tungsten layer featuring: good adhesion to underlying insulator layers; good conformality or step coverage; low resistivity; and without generating alpha particles in surrounding insulator layers, during the tungsten deposition procedure.

It is another object of this invention to deposit a metastable tungsten nitride layer, via an plasma enhanced chemical vapor deposition, (PECVD), or via a metal organic chemical vapor deposition, (MOCVD), procedure, to obtain the desired adhesion and step coverage for a subsequent tungsten layer.

It is yet another object of this invention to anneal the metastable tungsten nitride layer to form a lower resistivity tungsten layer.

In accordance with the present invention a method of forming a low resistivity, tungsten layer, featuring a deposition and annealing sequence that results in the desired tungsten adhesion and step coverage, with an absence of alpha particle generation to underlying layers, is described. A tungsten nitride layer is first deposited via PECVD, or MOCVD procedures, resulting in excellent adhesion to underlying insulator layers, such as a silicon dioxide layer, for a MOSFET application, or other insulator layers for a metal damascene structure application. A rapid thermal anneal, (RTA), procedure is then used to convert the high resistivity tungsten nitride layer to a lower resistivity tungsten layer, still maintaining the excellent adhesion to the underlying silicon oxide layers. Patterning of the tungsten layer is then used to form a tungsten gate structure, for the MOSFET application, or a reactive ion etch, (RIE), or chemical mechanical polishing, (CMP), procedure, to form the tungsten damascene structure, for a metal interconnect application.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a low resistivity tungsten layer, featuring good adhesion to underlying insulator layers, and good step coverage, will now be described in detail. A first iteration of this invention, in which a tungsten layer is used for fabrication of a MOSFET metal gate structure, on an underlying silicon dioxide gate structure, is described, and shown schematically in FIGS. 1–3. A P type, semiconductor substrate 1, with a <100> crystallographic orientation, is used, and shown schematically ib FIG. 1. Silicon dioxide layer 2, used as the MOSFET gate insulator layer, is obtained via thermal oxidation procedures, in an oxygen-steam ambient, at a thickness between about 10 to 100 Angstroms. The use of a tungsten gate structure, in place of a conventionally used polysilicon gate structure, offers work function, as well as density advantages. For example unwanted threshold voltage, $(V_t)$, shifts, can occur due to oxidation of polysilicon, at the polysilicon-gate insulator interface, resulting in thicker gate insulator at these edges. Therefore when fabricating MOSFET devices with channel lengths of about 0.10 um, the increased gate insulator thickness, at the polysilicon-gate insulator interface can be significant, resulting in Vt shifts. This phenomena can be alleviated via use of a metal gate, or a tungsten gate structure, in place of polysilicon. However the use of tungsten can present a set of unique concerns. For example chemical vapor deposited, (CVD), tungsten layers do not adhere to underlying insulator layers, such as silicon dioxide gate insulator layers, as well as counterpart tungsten layers obtained via plasma vapor deposited, (PVD), procedures. However the PVD, or sputtered, procedures can damage the silicon dioxide gate layer, resulting in deleterious alpha particle generation, and reliability concerns. Therefore a process for creating a tungsten layer, for use as a MOSFET gate structure, exhibiting good adhesion, an absence of alpha particle generation, and low resistivity, is used, and now described.

Figure 1:
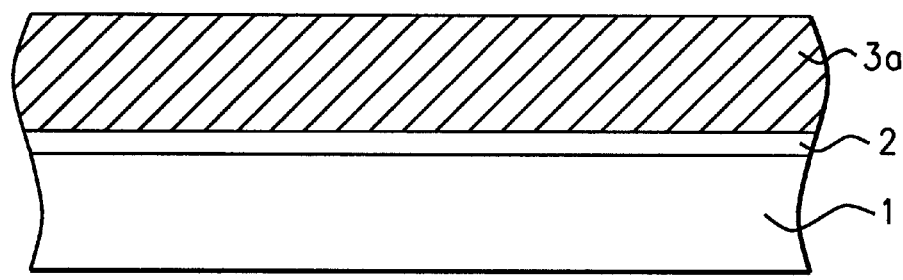
FIGS. 1–3, which schematically in cross-sectional style, show key stages of fabrication used to form a tungsten gate structure, using the deposition of the metastable layer, followed by the reduction of the metastable layer to a low resistivity tungsten gate structure.
Figure 2:
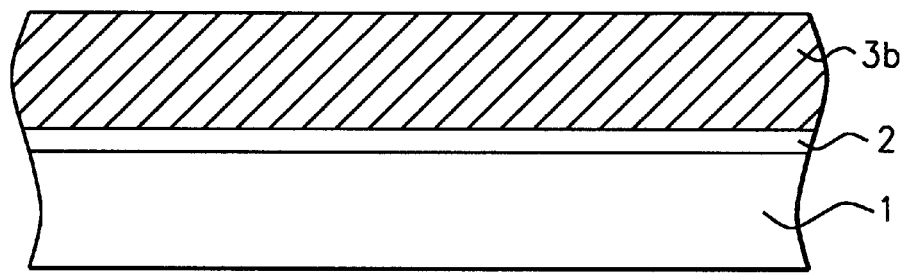

A metastable tungsten nitride, ($WN_x$), layer 3a, with the integer x being between about 0.2 to 1, shown schematically in FIG. 1, is deposited via a PECVD or via a MOCVD procedure, to a thickness between about 1000 to 4000 Angstroms. Tungsten nitride layer 3a, is deposited at a temperature between about 150 to 450° C., using $WF_6$ and $NH_3$ as reactants. The PECVD or MOCVD mode of deposition provides good adhesion of tungsten nitride layer 3a, to underlying silicon dioxide layer 2, without damaging the underlying gate insulator layer. However the resistivity of the metastable, tungsten nitride layer is between about 800 to 5000 E-6 ohm-cm. Therefore an anneal procedure, performed in an inert ambient, such as argon, or performed in a vacuum, is used to convert the high resistivity, metastable tungsten nitride layer 3a, to a lower resistivity, tungsten layer 3b. The anneal procedure is performed using rapid thermal annealing, (RTA), procedures, at a temperature between about 500 to 800° C., for a time between about 30 to 120 sec, resulting in the creation of tungsten layer 3b, with a resistivity between about 20 to 100 E-6 ohm-cm. Tungsten layer 3b, shown schematically in FIG. 2, formed via deposition of a metastable tungsten nitride layer, followed by an anneal procedure, provides the desired low resistivity, good adhesion to, and without damage to, underlying silicon dioxide gate insulator layer 2.

Figure 3:
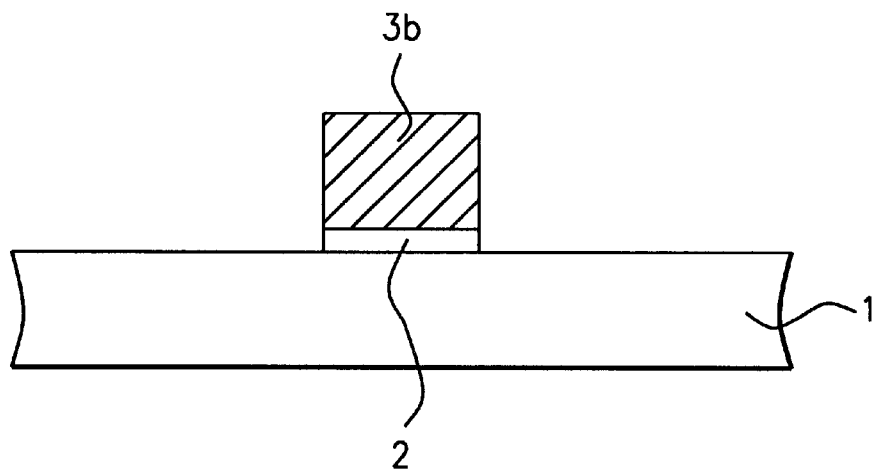
Figure 4:
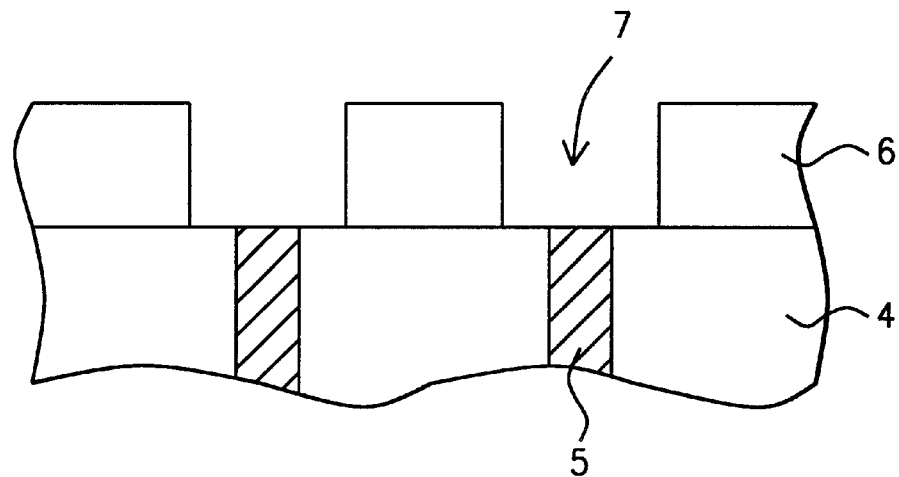
FIGS. 4–7, which schematically in cross-sectional style, show key stages of fabrication used to form a tungsten damascene structure, again using the deposition of the metastable, tungsten nitride layer, followed by the reduction of the metastable layer to a low resistivity tungsten damascene structure.

The result of defining a metal gate structure, comprised of tungsten layer 3b, is schematically shown in FIG. 3. This is accomplished via conventional photolithographic and anisotropic, RIE procedures, using $Cl_2$ or $SF_6$ as an etchant for tungsten.

A second iteration of this invention, described schematically in FIGS. 4–7, again entails the use of tungsten, obtained from deposition of, and annealing of a metastable tungsten nitride layer, in this case to provide a low resistivity metal for damascene structures. Metal plug structures 5, comprised of tungsten, are shown schematically in FIG. 4, located in via holes, formed in an interlevel dielectric layer 4, such as a silicon oxide layer, or a borophosphosilicate glass, (BPSG), layer. After deposition of ILD layer 6, again comprised of either silicon oxide, or BPSG, damascene openings 7, are formed in ILD layer 6, via conventional photolithographic and RIE procedures, using $CHF_3$ as an etchant, exposing the top surface of tungsten plug structures 5.

Figure 5:
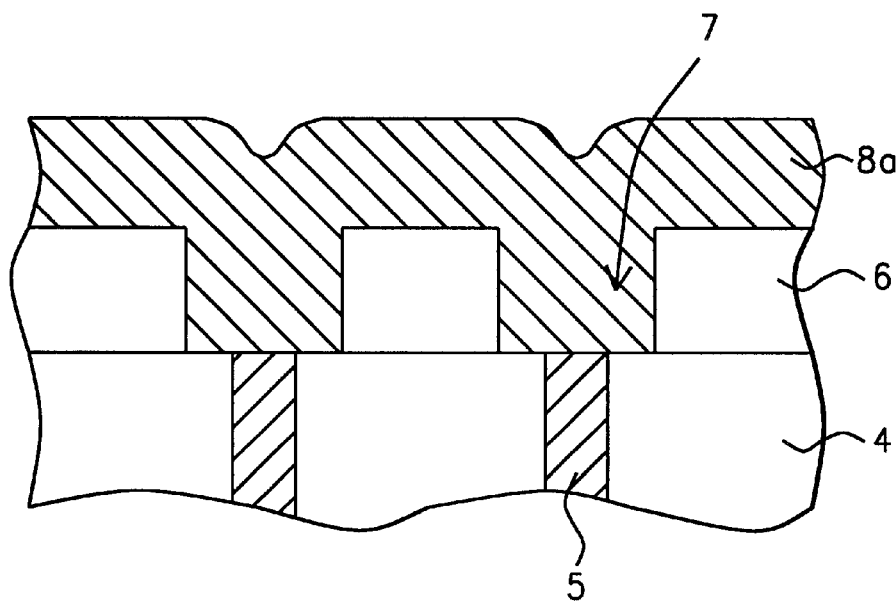
Figure 6:
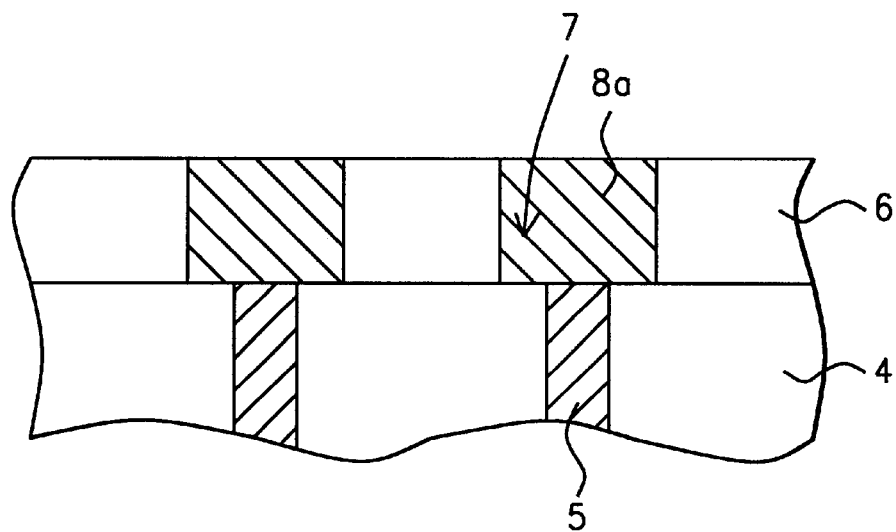

After removal of the photoresist shape, used to define openings 7, in ILD layer 6, via plasma oxygen ashing and careful wet cleans, a tungsten containing layer 8a, is deposited, completely filling openings 7. As was the case in the first iteration of this invention, a tungsten layer, possessing good step coverage, good adhesion to adjacent insulator layers, and low resistivity, is desired. Therefore the process sequence used to form tungsten gate structures, in the first iteration, is again used here. A PECVD or a MOCVD procedure is used to deposit metastable tungsten nitride layer 8a, at a thickness between about 1000 to 4000 Angstroms, completely filling openings 7. The PECVD or MOCVD procedure, performed at a temperature between about 150 to 450° C., using $WF_6$ and $NH_3$ as reactants, provides the needed step coverage to adequately coat the sides of openings 7, while providing adequate adhesion to underlying ILD layer 6. However the resistivity of metastable tungsten nitride layer 8a, shown schematically in FIG. 5, is between about 800 to 5000 E-6 ohm-cm.

Figure 7:
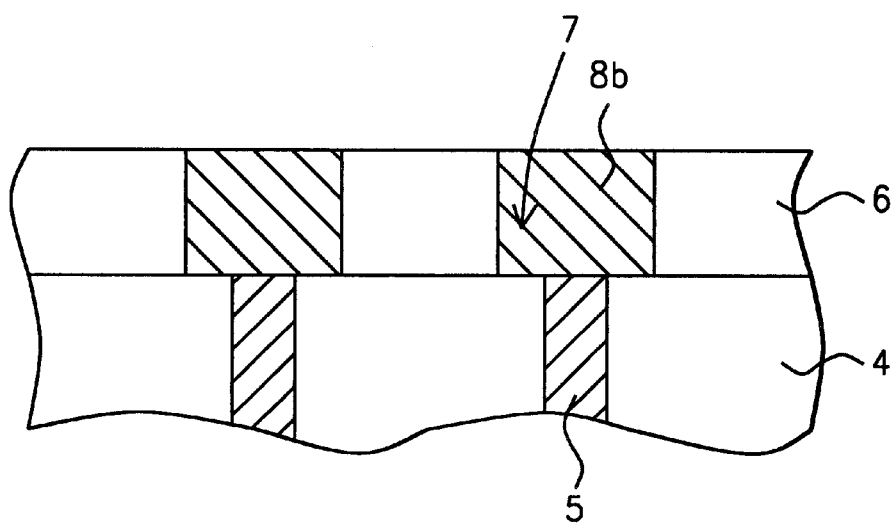

Prior to converting tungsten nitride layer 8a, to a lower resistivity tungsten layer, unwanted regions of tungsten nitride layer 8a, are removed from the top surface of ILD layer 6, via a chemical mechanical polishing procedure, or via a selective RIE procedure, using $Cl_2$ or $SF_6$ as an etchant. This procedure results in the formation of tungsten nitride damascene structure 8a, in openings 7. This is shown schematically in FIG. 6. Conversion of metastable tungsten nitride 8a, to a lower resistivity tungsten structure, is again accomplished via an RTA procedure, performed at a temperature between about 500 to 800° C., in an argon, or in a vacuum, for a time between about 30 to 120 sec. The anneal procedure results in a tungsten damascene structure 8b, in openings 7, featuring a resistivity between about 20 to 100 E-6 ohm-cm. This is schematically shown in FIG. 7. It desired metastable tungsten nitride layer 8a, can be converted to lower resistivity tungsten layer 8b, prior to the CMP or RIE procedure, used to remove material from the top surface of ILD layer 6.

While this invention has been particularly shown and described with reference to, the preferred embodiments thereof, it will be understood by those skilled in the art that various changes in form and details may be made without departing from the spirit and scope of this invention.

What is claimed is:

1. A method of forming a tungsten damascene structure, comprising the steps of:

providing an opening in an overlying interlevel dielectric layer, exposing a top surface of a tungsten plug structure, located in a via hole in an underlying interlevel dielectric layer;

depositing a tungsten nitride layer, completely filling said opening in said overlying interlevel dielectric layer;

performing an anneal procedure to convert said tungsten nitride layer to a tungsten layer; and removing portions of said tungsten layer from the top surface of said overlying ILD layer, to create said tungsten damascene structure in said opening in said overlying ILD layer.

2. The method of claim 1, wherein said underlying interlevel dielectric layer is comprised of either silicon oxide, or of a borophosphosilicate glass.

3. The method of claim 1, wherein said overlying interlevel dielectric layer is comprised of either silicon oxide, or of a borophosphosilicate glass.

4. The method of claim 1, wherein said tungsten nitride layer is deposited via a plasma enhanced chemical vapor deposition, (PECVD), or a metal organic chemical vapor deposition, (MOCVD), procedure, to a thickness between about 1000 to 4000 Angstroms, at a temperature between about 150 to 450° C., using $WF_6$ and $NH_3$ as reactants.

5. The method of claim 1, wherein the resistivity of said tungsten nitride layer is between about 800 to 5000 E-6 ohm-cm.

6. The method of claim 1, wherein said anneal procedure, is a rapid thermal anneal procedure, performed at a temperature between about 500 to 800° C., in a argon ambient, or in vacuum, for a time between about 30 to 120 sec.

7. The method of claim 1, wherein the resistivity of said tungsten layer is between about 20 to 100 E-6 ohm-cm.

8. The method of claim 1, wherein said tungsten damascene structure is formed via removal of said tungsten layer from the top surface of said overlying ILD layer, via a chemical mechanical polishing procedure, or via a selective RIE procedure, using $Cl_2$ or $SF_6$ as an etchant.

* * * * *